(12) United States Patent
Chang et al.

(10) Patent No.: US 10,999,929 B2
(45) Date of Patent: May 4, 2021

(54) EXPANSION CARD INTERFACES FOR HIGH-FREQUENCY SIGNALS AND METHODS OF MAKING THE SAME

(71) Applicant: Quanta Computer Inc., Taoyuan (TW)

(72) Inventors: Che-Wei Chang, Taoyuan (TW); Cheng-Hsien Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/714,181

(22) Filed: Dec. 13, 2019

(65) Prior Publication Data

US 2020/0383205 A1 Dec. 3, 2020

Related U.S. Application Data

(60) Provisional application No. 62/853,956, filed on May 29, 2019.

(51) Int. Cl.
| | |
|---|---|
| *H05K 1/11* | (2006.01) |
| *H05K 1/14* | (2006.01) |
| *H05K 5/02* | (2006.01) |
| *H05K 5/04* | (2006.01) |
| *G06K 19/067* | (2006.01) |
| *G06K 19/077* | (2006.01) |

(Continued)

(52) U.S. Cl.
CPC ............ *H05K 1/117* (2013.01); *H05K 3/043* (2013.01); *H05K 3/06* (2013.01); *H05K 3/4007* (2013.01); *H05K 2201/09663* (2013.01)

(58) Field of Classification Search
CPC ... H05K 1/11; H05K 1/14; H05K 3/34; H05K 5/02; H05K 5/04; G06K 19/067; G06K 19/077; H01R 12/00; H01R 12/16; H01R 13/64; H01R 13/6461
USPC ......... 174/268, 260, 261; 235/492; 257/679, 257/778; 439/79, 83, 137, 157, 379; 361/737, 752, 760, 796
See application file for complete search history.

(56) References Cited

U.S. PATENT DOCUMENTS

| | | | |
|---|---|---|---|
| 5,492,478 A | | 2/1996 | White |
| 6,115,260 A | * | 9/2000 | Nakajima ............... H05K 1/117 174/260 |

(Continued)

FOREIGN PATENT DOCUMENTS

| | | |
|---|---|---|
| CN | 106455343 A | 2/2017 |
| JP | H0652941 A | 2/1994 |

(Continued)

OTHER PUBLICATIONS

Extended European Search Report for EP Application No. 20158570.0, dated Sep. 18, 2020.

(Continued)

*Primary Examiner* — Xiaoliang Chen
(74) *Attorney, Agent, or Firm* — Nixon Peabody LLP

(57) ABSTRACT

The present disclosure describes expansion card interfaces for a printed circuit board and methods of making the same. The methods include forming electrical pads of the expansion card interface on a substrate, and dividing at least one electrical pad into a first portion and a second portion. The resulting expansion card interfaces have the first portion conductively coupled to a circuit on the printed circuit board, and the second portion conductively isolated from the first portion.

14 Claims, 11 Drawing Sheets

(51) Int. Cl.
*H01R 12/00* (2006.01)
*H01R 13/64* (2006.01)
*H01R 13/6461* (2011.01)
*H05K 3/04* (2006.01)
*H05K 3/06* (2006.01)
*H05K 3/40* (2006.01)

(56) References Cited

U.S. PATENT DOCUMENTS

| | | | | |
|---|---|---|---|---|
| 6,589,061 | B1* | 7/2003 | Korsunsky | H05K 1/117 439/79 |
| 6,896,523 | B2* | 5/2005 | Nishizawa | G06K 19/07 439/60 |
| 7,009,846 | B1* | 3/2006 | Wang | H05K 5/0286 235/492 |
| 7,032,827 | B2* | 4/2006 | Wang | G06K 19/077 235/441 |
| 7,909,611 | B2* | 3/2011 | Miller | H01R 27/00 439/60 |
| 8,167,659 | B2* | 5/2012 | Miller | H01R 13/642 439/630 |
| 2001/0001507 | A1* | 5/2001 | Fukuda | H01L 23/3121 257/778 |
| 2001/0009505 | A1* | 7/2001 | Nishizawa | G06K 19/07732 361/737 |
| 2002/0020911 | A1* | 2/2002 | Lee | H01L 23/10 257/700 |
| 2003/0161125 | A1* | 8/2003 | Dobler | G06F 1/186 361/784 |
| 2004/0062112 | A1* | 4/2004 | Nishizawa | G06K 19/07743 365/202 |
| 2005/0002241 | A1* | 1/2005 | Park | G06F 13/4086 365/199 |
| 2005/0082375 | A1* | 4/2005 | Nishizawa | G06K 19/077 235/492 |
| 2005/0253239 | A1* | 11/2005 | Nishizawa | G06K 19/077 257/679 |
| 2005/0279838 | A1* | 12/2005 | Wang | G06K 19/07732 235/492 |
| 2005/0281010 | A1* | 12/2005 | Wang | H05K 1/117 361/752 |
| 2006/0133058 | A1* | 6/2006 | Hur | H05K 3/325 361/796 |
| 2006/0208091 | A1* | 9/2006 | Nishizawa | G06K 19/07732 235/492 |
| 2007/0228509 | A1* | 10/2007 | Okada | H05K 1/0256 257/503 |
| 2008/0065830 | A1* | 3/2008 | Aoki | G06K 19/07732 711/115 |
| 2008/0135628 | A1* | 6/2008 | Aoki | G06K 19/07 235/492 |
| 2008/0225498 | A1* | 9/2008 | Osako | H01R 12/7005 361/737 |
| 2010/0025480 | A1* | 2/2010 | Nishizawa | G06K 19/07732 235/492 |
| 2010/0081297 | A1* | 4/2010 | Miller | H01R 27/00 439/60 |
| 2010/0081315 | A1* | 4/2010 | Miller | H01R 13/642 439/377 |
| 2011/0097938 | A1* | 4/2011 | Miller | H01R 13/642 439/633 |
| 2016/0049742 | A1* | 2/2016 | Han | G11C 16/30 365/185.18 |
| 2017/0148492 | A1* | 5/2017 | Han | G06K 19/07732 |
| 2017/0154003 | A1* | 6/2017 | Han | G06F 13/4068 |
| 2017/0197239 | A1* | 7/2017 | Lim | B21D 11/22 |
| 2017/0271818 | A1* | 9/2017 | Lynch | H01R 12/721 |
| 2018/0088865 | A1* | 3/2018 | Lee | G06F 3/0604 |
| 2018/0138637 | A1 | 5/2018 | Huang | |
| 2019/0205277 | A1* | 7/2019 | Koh | H05K 5/026 |
| 2019/0207334 | A1* | 7/2019 | Koh | H01R 13/245 |
| 2019/0393633 | A1* | 12/2019 | Saito | H01R 12/725 |

FOREIGN PATENT DOCUMENTS

| | | |
|---|---|---|
| JP | H0654133 U | 7/1994 |
| JP | 2002245997 A | 8/2002 |
| JP | 2007128812 A | 5/2007 |
| JP | 2008004380 A | 1/2008 |
| JP | 2018110104 A | 7/2018 |

OTHER PUBLICATIONS

TW Office Action for Application No. 109101699, dated Dec. 18, 2020, w/ First Office Action Summary.
TW Search Report for Application No. 109101699, dated Dec. 18, 2020, w/ First Office Action.
JP Office Action for Application No. 2020-029182, dated Mar. 23, 2021, w/ First Office Action Summary.

* cited by examiner

EXPANSION CARD INTERFACES FOR HIGH-FREQUENCY SIGNALS AND METHODS OF MAKING THE SAME

CROSS-REFERENCE TO RELATED APPLICATION

This application claims priority under 35 U.S.C. § 119 to U.S. Provisional Application No. 62/853,956, entitled "BACK-DRILL APPLICATION TO TEST-PAD FOR GOLDEN FINGER STUB ELIMINATION," and filed on May 29, 2019. The contents of that application are hereby incorporated by reference in their entirety.

FIELD OF THE INVENTION

The present invention relates to connectors for computer systems and more specifically, to expansion card interfaces within computer systems for high-frequency signals.

BACKGROUND

Expansion cards and other add-on cards can have interfaces, hereinafter expansion card interfaces. These expansion card interfaces are used extensively in computer systems. For example, many expansion cards (daughter cards) use expansion card interfaces for connecting to a bus on a main board (motherboard) of a computer system. One specific type of connector that can receive an expansion card is a peripheral component interconnect express (PCIe) connector, such as a PCIe Gen 4 or Gen 5 connector.

FIG. 1 illustrates a conventional connection of an expansion card 100 with a bus 102, such as a PCIe bus. The bus 102 includes connector pins 104 within a slot 106 defined by a housing 108. The connector pins 104 contact both sides of the expansion card 100, when the expansion card 100 is inserted into the slot 106. At least one side of the expansion card 100 includes electrical pads (FIG. 2), which are commonly referred to as golden fingers. The connector pins 104 contact the electrical pads, which forms an electrical connection between the expansion card 100 and the bus 102.

FIG. 2 illustrates an interface region 200 of a conventional expansion card, such as the expansion card 100 of FIG. 1. The interface region 200 includes four electrical pads, including two signal pads 202 and two ground pads 204 (collectively referred to as "contact pads" or "pads"). The signal pads 202 and the ground pads 204 are formed on a substrate 206 of a printed circuit board (PCB) having the interface region 200. The signal pads 202 and the ground pads 204 extend to the edge 206a of the substrate 206. The signal pads 202 carry one or more signals to and from the electrical circuit 205 on the printed circuit board and the corresponding bus (e.g., bus 102 of FIG. 1), within which the interface region 200 is inserted.

Connector pins (e.g., connector pins 104 of FIG. 1) of the bus (e.g., bus 102 of FIG. 1) are configured to contact the signal pads 202 and the ground pads 204 at contact points 208 (represented by the dotted circles). Based on the lengths of the signal pads 202 and the ground pads 204, and the depth of the corresponding bus (e.g., bus 102 of FIG. 1), the contact points 208 are generally in the middle 214 of the signal pads 202 and the ground pads 204 (represented approximately by the dotted line).

The lengths of the signal pads 202 and the ground pads 204, from generally the contact points 208 to the distal ends 202a and 204a, form signal stubs 210 and ground stubs 212, respectively (collectively referred to as contact stubs or stubs). The lengths of the signal pads 202 from generally the contact points 208 to the proximal ends 202b, opposite from the distal ends 202a, form signal electrical contacts 216. The lengths of the ground pads 204 from generally the contact points 208 to the proximal ends 204b, opposite from the distal ends 204a, form ground electrical contacts 218. The signal electrical contacts 216 and the ground electrical contacts 218 are collectively referred to as electrical contacts.

The signal stubs 210, the ground stubs 212, or both can cause reflections in the signal electrical contacts 216, the ground electrical contacts 218, or both; thereby potentially reducing signal margins. For connections of high-frequency signals using the conventional expansion card with interface region 200, the longer the signal stubs 210, the ground stubs 212, or both; the greater the reduction in the signal margin.

FIG. 3 illustrates a plot 300 of signal loss measurements for different lengths of signal stubs 210 and ground stubs 212 (both from FIG. 2) as a function of signal frequency. The line 302 represents an 80 millimeter (mm) stub; the line 304 represents a 110 mm stub; and the line 306 represents a 160 mm stub. As shown, the increase of signal loss measurements coincides with the increase in the length of the contact stubs.

Accordingly, there is a need for expansion card interfaces for use in connections of high-frequency signals that do not suffer from a reduction in signal margin, and methods for making such expansion card interfaces.

SUMMARY

According to one embodiment, the method of forming an expansion card interface for a printed circuit board is disclosed. The method includes forming electrical pads of the expansion card interface on a substrate. The method further includes dividing at least one electrical pad into a first portion and a second portion. The first portion is formed to be conductively coupled to a circuit on the printed circuit board, and the second portion is formed to be conductively isolated from the first portion.

Another aspect of the embodiment includes the first portion being configured to contact a connector pin of a bus with the expansion card interface inserted into the bus. Still another aspect of the embodiment includes the dividing that occurs about 0.1 millimeters from a contact point between the connector pin and the at least one pad. Yet another aspect includes the dividing being accomplished by a mechanical modification of the least one pad to form the first portion and the second portion. The mechanical modification can include back-drilling of the at least one pad. The mechanical modification can alternatively include the cutting of the at least one pad. The cutting of the at least one pad can occur without cutting the printed circuit board. The dividing alternatively can be accomplished by a chemical modification of the at least one pad to form the first portion and the second portion. The chemical modification can include chemically etching the at least one pad. In still a further aspect, the forming of the at least one pad can include forming the at least one pad to include a narrow portion and a wide portion. In an additional aspect, the dividing of the at least one pad can occur on the narrow portion adjacent to the wide portion. In another aspect, the forming of the at least one pad includes providing an indicator, and the dividing of the at least one pad occurs at the indicator. In another aspect, the first portion can correspond substantially to the wide portion, and the second portion can correspond substantially to the narrow portion. In another aspect, the expansion card interface includes ground pads and signal pads. In still another aspect, the at least one pad includes all of the signal pads. In still another aspect, the at least one pad includes at least one of the signal pads.

According to another embodiment, an expansion card interface for a printed circuit board is disclosed. The expansion card interface includes substrates having an edge, and signal electrical contacts configured to communicate one or more signals to and from the printed circuit board. The signal electrical contacts have ends that longitudinally correspond with contact points of connector pins of a bus, with the expansion card interface fully inserted into the bus. The expansion card interface also includes electrical stubs conductively isolated from the signal electrical contacts, with each of the electrical stubs being aligned with a separate one of the signal electrical contacts.

According to another aspect, the electrical stubs are narrower than the signal electrical contacts. According to yet another aspect, the ground electrical contacts have ends that longitudinally correspond with contact points of connector pins of a bus, with the expansion card interface fully inserted into the bus. According to another aspect, the expansion card interface also includes ground stubs conductively isolated from the ground electrical contacts, with each of the ground stubs being aligned with a separate one of the ground electrical contacts.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments and are, therefore, not to be considered as limitations on the scope of the various embodiments or claims.

DETAILED DESCRIPTION

Figure 1:
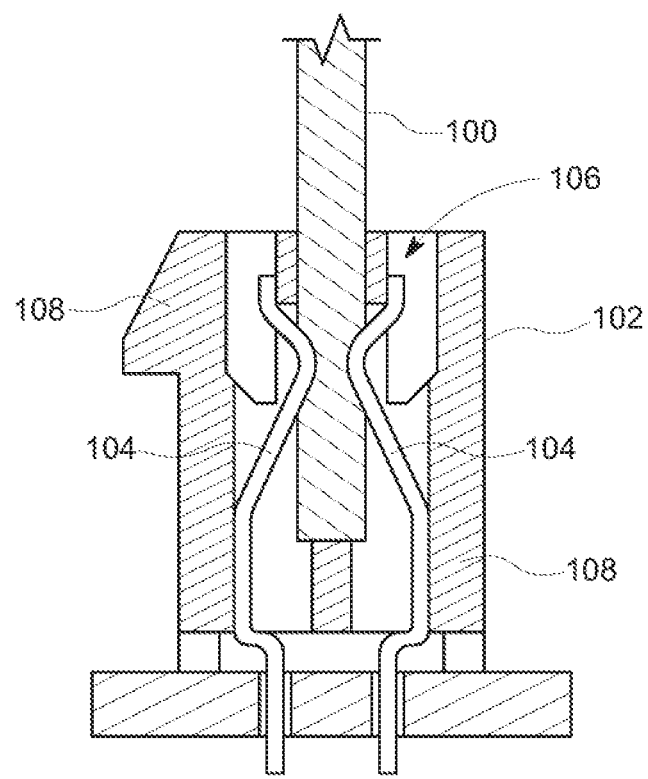
FIG. 1 illustrates a cross section of a conventional expansion card inserted into a bus.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

To solve the above-identified issue of the reduction in signal margin, electrical contacts and contact stubs are formed such that the contact stubs are conductively isolated from the electrical contacts. Pads are formed and subsequently divided into the electrical contacts and the contact stubs such that the contact stubs and the electrical contacts are conductively isolated. Because the electrical contacts are conductively isolated from the contact stubs, the contact stubs have no effect, or a reduced effect, on the signal margin.

Figure 4:
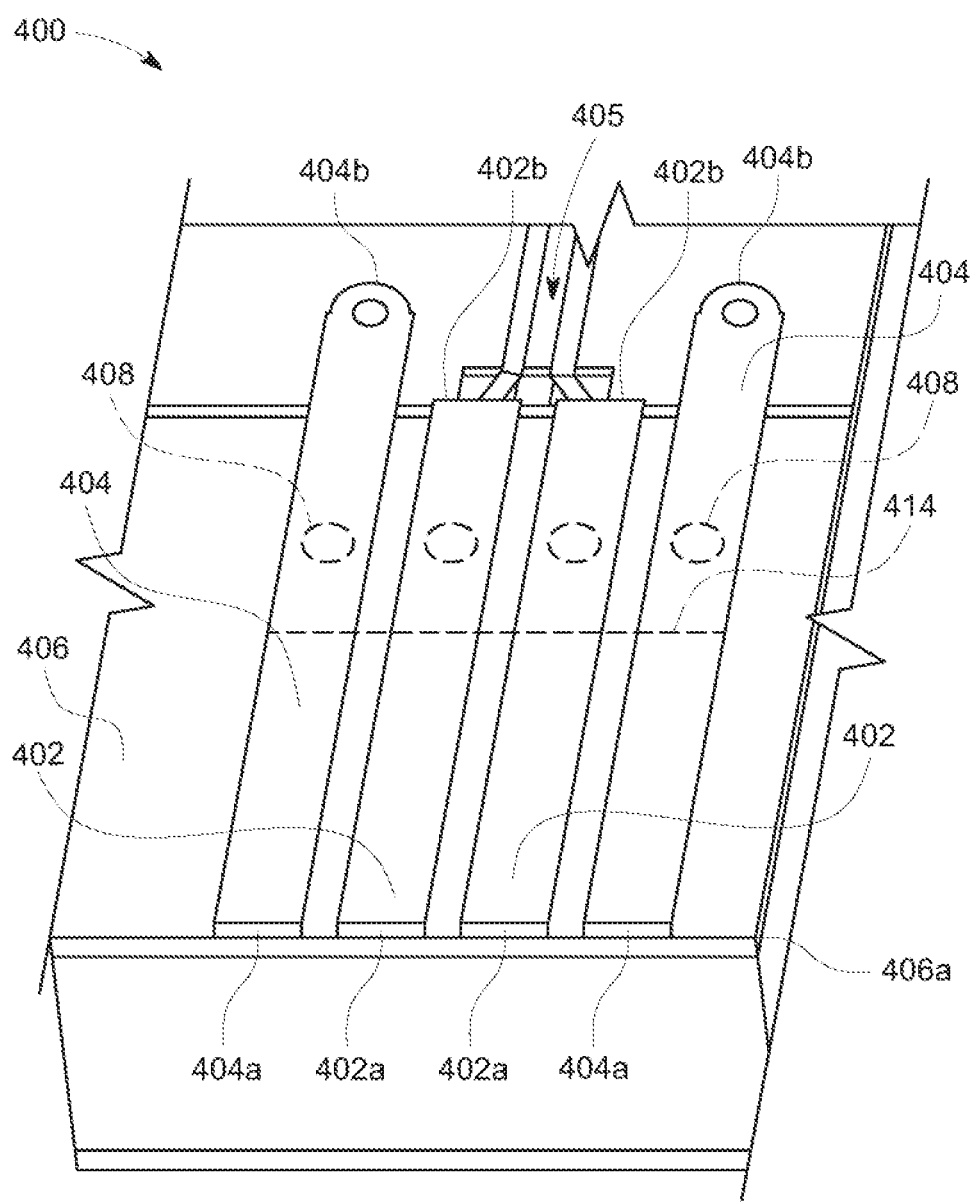
FIG. 4 illustrates an interface region of an expansion card prior to dividing the contact pads, according to aspects of the present disclosure.

FIG. 4 illustrates an interface region 400 of an expansion card prior to dividing the contacts pads, according to aspects of the present disclosure. The interface region 400 includes four pads, which include two signal pads 402 and two ground pads 404. Although only two signal pads 402 and two ground pads 404 are shown in FIG. 4, any expansion card formed with interface region 400 can have more signal pads 402, and can have more ground pads 404. Thus, the two signal pads 402 and the two ground pads 404 are shown for convenience only.

The signal pads 402 and the ground pads 404 are conventional golden fingers on a substrate 406 of a printed circuit board. The signal pads 402 and the ground pads 404 extend parallel to each other towards the edge 406a of the substrate 406. The signal pads 402 carry one or more signals to and from the electrical circuit 405 on the substrate 406 and the corresponding bus (e.g., bus 102 of FIG. 1), within which the interface region 400 is configured to be inserted. The ground pads 404 establish the ground between the interface region 400 and the corresponding bus (e.g., bus 102 of FIG. 1). The signal pads 402 have distal ends 402a and proximal ends 402b. Similarly, the ground pads 404 have distal ends 404a and proximal ends 402b. The signal pads 402 and the ground pads 404 can be formed initially by any conventional printed circuit board forming techniques, similar to the interface region 200 discussed above. Indeed, in one or more embodiments, the interface region 400 can be identical to the interface region 200, but the subsequent processing distinguishes the portions 200 and 400.

The contact point 408 correspond to the locations at which connector pins (e.g., connector pins 104 of FIG. 1) of a corresponding bus (e.g., bus 102 of FIG. 1) contact the signal pads 402 and the ground pads 404. Accordingly, the portions of the signal pads 402 and the ground pads 404 below the dotted line 414 correspond to the contact stubs. To remove the effects of such contact stubs, the signal pads 402 and the ground pads 404 are divided into two portions, as described in detail below.

Figure 5:
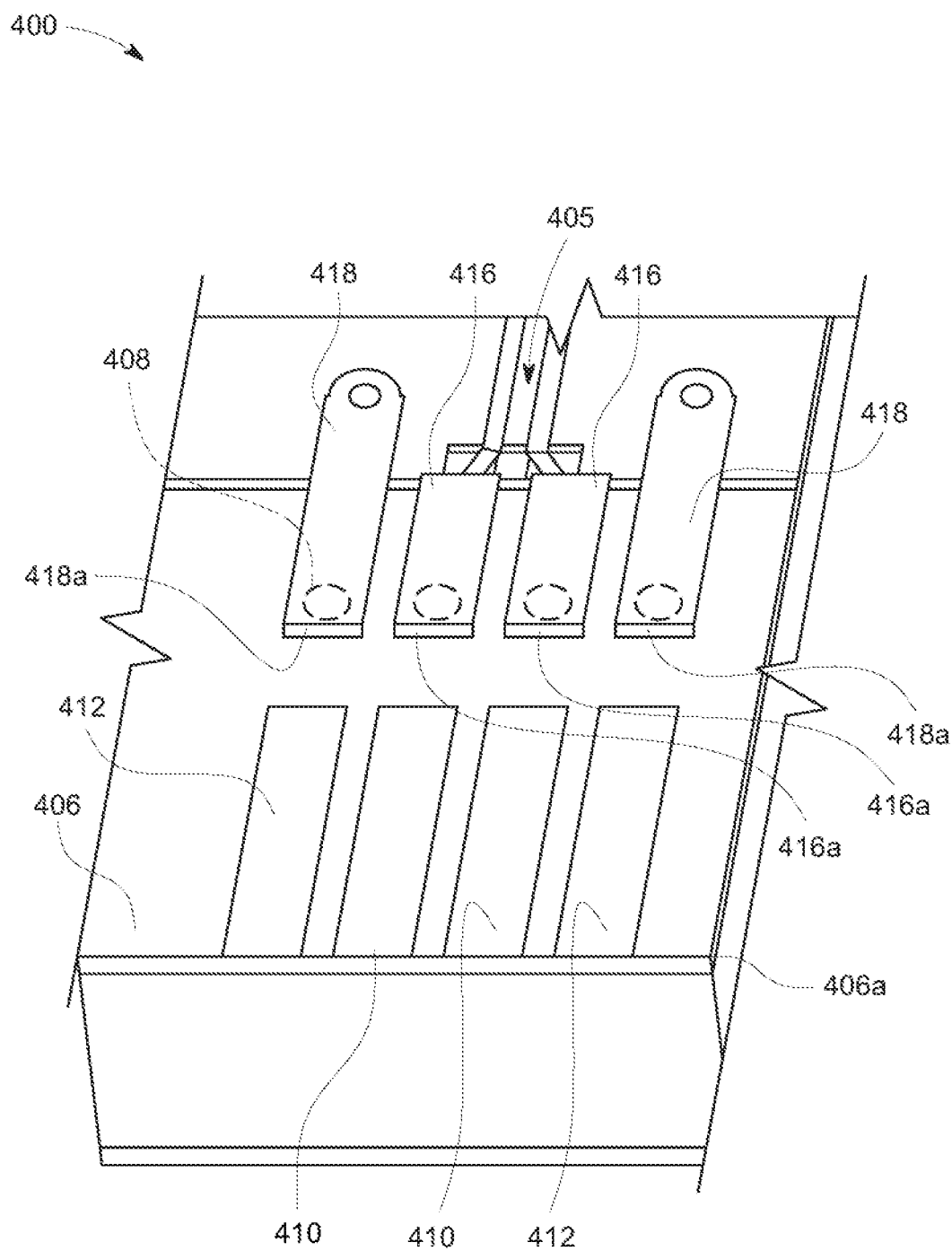
FIG. 5 illustrates the interface region of the expansion card of FIG. 4 after dividing the contact pads, according to aspects of the present disclosure.

FIG. 5 illustrates the interface region 400 of the expansion card of FIG. 4 after dividing the contact pads 402 and 404, according to aspects of the present disclosure. Specifically, the signal pads 402 and the ground pads 404 are divided into two portions. The first portions correspond to the signal electrical contacts 416 and the ground electrical contacts 418, respectively. The second portions correspond to the signal stubs 410 and the ground stubs 412, respectively. Because the signal electrical contacts 416 are divided from the signal stubs 410, the signal electrical contacts 416 are conductively isolated from the signal stubs 410. Similarly, because the ground electrical contacts 418 are divided from the ground stubs 412, the ground electrical contacts 418 are conductively isolated from the ground stubs 412. The signal stubs 410 and the ground stubs 412 also are conductively isolated from the circuit 405 of the printed circuit board. The conductive isolation prevents or prohibits the signal stubs 410 and the ground stubs 412 from affecting the signal margins. The connector pins (e.g., connector pins 104 of FIG. 1) of the bus (e.g., bus 102 of FIG. 1) can still contact the signal electrical contacts 416 and the ground electrical contacts 418 with the expansion card inserted into the bus, as illustrated by the contact point 408 still being aligned with the signal electrical contacts 416 and the ground electrical contacts 418. Indeed, the distal ends 416a of the signal electrical contacts 416, and the distal ends 418a of the ground electrical contacts 418, longitudinally correspond with the contact points 408 of the connector pins (e.g., connector pins 104 of FIG. 1) of the bus (e.g., bus 102 of FIG. 1), with the interface region 400 of the expansion card fully inserted into the bus.

The pads 402 and 404 can be divided into the respective electrical contacts 416 and 418, and the contact stubs 410 and 412, according to one or more processing steps. In one or more embodiments, the dividing can be accomplished by mechanically modifying the pads 402 and 404 to form the first portions, corresponding to the electrical contacts 416 and 418, respectively, and the second portions, corresponding to the stubs 420 and 422, respectively. The mechanical modification can be any one or more mechanical processes that divide the pads 402 and 404 into conductively isolated first and second portions. In one or more embodiments, the mechanical modification can be accomplished by drilling, such as back-drilling the pads 402 and 404. In one or more embodiments, the mechanical modification can be accomplished by cutting the pads 402 and 404. However, the mechanical modification can be any other mechanical process(es) that can conductively separate the electrical contacts 416 and 418 from the stubs 410 and 412.

In one or more embodiments, the mechanical modification, such as drilling or cutting, can modify only the pads 402 and 404 and not the substrate 406. For example, the cutting may cut into and through the pads 402, pads 404, or both without cutting into the substrate 406. However, in one or more alternative embodiments, the mechanical modification can include partially modifying the substrate 406. For example, the cutting can include partially cutting into the substrate 406.

In one or more embodiments, the dividing can be accomplished by chemically modifying the pads 402 and 404 to form the first portions, corresponding to the electrical contacts 416 and 418, respectively; and the second portions, corresponding to the stubs 410 and 412, respectively. The chemical modification can be any one or more chemical processes that divide the pads 402 and 404 into conductively isolated first and second portions. In one or more embodiments, the chemical modification can be chemical etching. However, the chemical modification can be any other chemical process(es) that can conductively separate the electrical contacts 416 and 418 from the stubs 420 and 422.

Similar to the mechanical modification, in one or more embodiments, the chemical modification can modify only the pads 402 and 404 and not the substrate 406. For example, the etching may etch into and through the pads 402, pads 404, or both; without etching into the substrate 406. This may occur based on the pads 402 and 404 being made of a different material than the substrate 406. However, in one or more alternative embodiments, the chemical modification can include partially modifying the substrate 406.

In one or more embodiments, the dividing can be generally about 0.1 millimeters below the contact point 408 (i.e., towards the ends 402a and 404a) between the connector pin (FIG. 1) and the signal pads 402 and the ground pads 404, although other distances can be used.

Although all four of the pads 402 and 404 are divided into first and second portions, in one or more embodiments, less than all of the pads 402 and 404 can be divided into the first and second portions. For example, in one or more embodiments, only the signal pads 402 may be divided into the first and second portions. Alternatively, in one or more embodiments, only the ground pads 404 may be divided into the first and second portions. In one or more embodiments, less than all of the signal pads 402, ground pads 404, or both, may be divided into the respective first and second portions. Accordingly, the processes disclosed herein for dividing the pads can be applied to one or more signal pads, one or more ground pads, or both, to achieve better performance in signal margin by reducing or eliminating the effects of the contact stubs.

Although the process of dividing the pads into first and second portions, described above with respect to FIGS. 4 and 5, begins with a conventional configuration for the pads 402 and 404, in one or more embodiments, the process can instead begin with a different structure.

Figure 6:
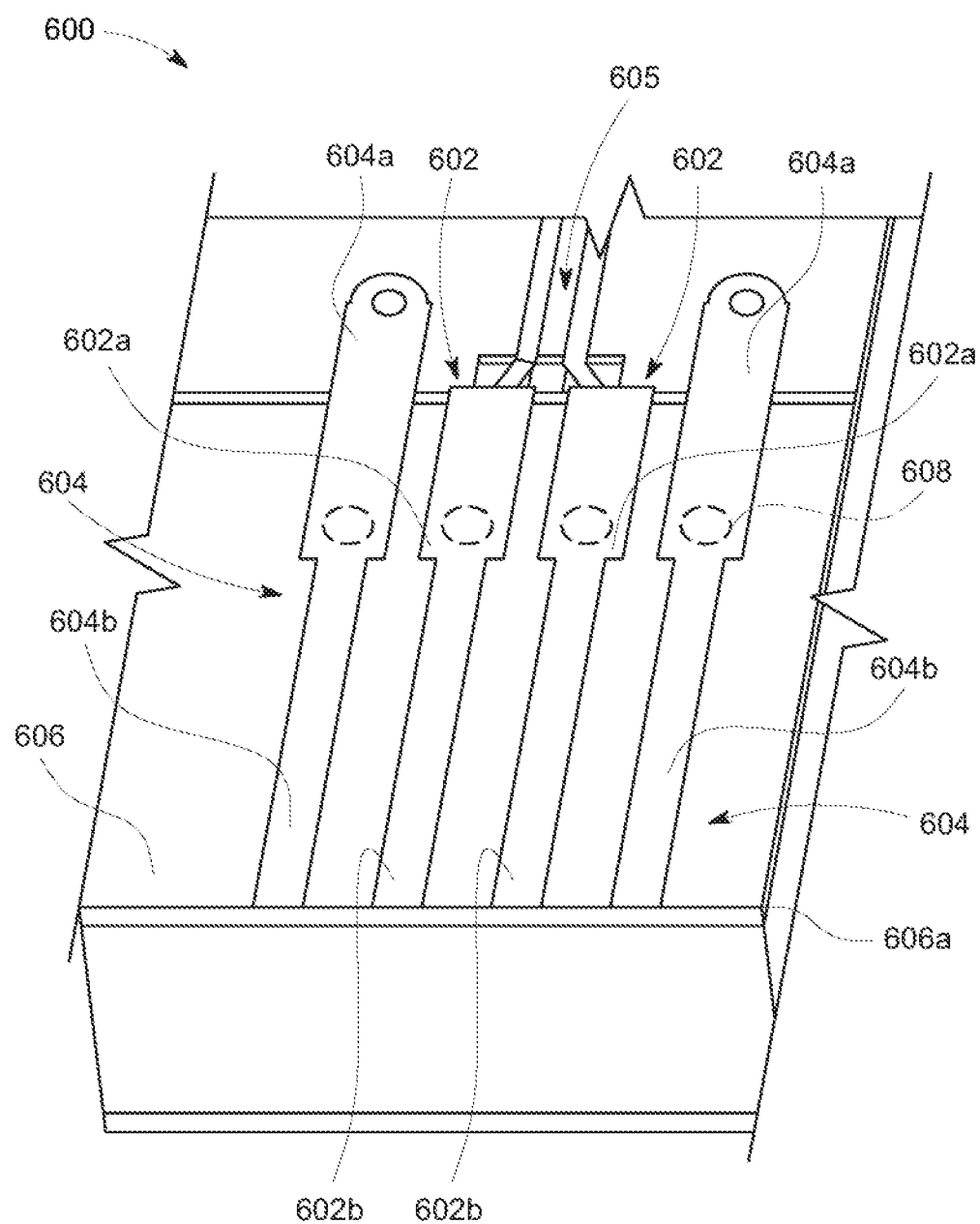
FIG. 6 illustrates another interface region of an expansion card prior to dividing the contact pads, according to aspects of the present disclosure.

FIG. 6 illustrates an interface region 600 of another expansion card prior to dividing the contact pads, according to aspects of the present disclosure. The interface region 600 includes four pads, which include two signal pads 602 and two ground pads 604. Although only two signal pads 602 and two ground pads 604 are shown in FIG. 6, the interface region 600 of the expansion card can have more signal pads 602 and more ground pads 604. Thus, the two signal pads 602 and the two ground pads 604 are shown for convenience only.

Unlike the signal pads 402 and the ground pads 404 of the interface region 400 in FIG. 4, the signal pads 602 and the ground pads 604 have wide portions 602a and 604a, respectively, and narrow portions 602b and 604b, respectively, which are narrower than the wide portions 602a and 604a. The signal pads 602 and the ground pads 604 can be formed according to any conventional printed circuit board forming techniques, but with narrower portions 602b and 604b.

The narrow portions 602b and 604b can reduce the amount of material needed to be removed when dividing the pads 602 and 604. In addition, the narrow portions 602b and 604b are not required during operation of the resulting expansion card, such that the width of the narrow portions 602b and 604b need not be the same as the width of the wide portions 602a and 604a. Moreover, the narrow portions 602b and 604b still allow for conventional processing using the electrical pads 602 and 604, such as use of a plating brush, so that an original plating process need not be changed.

Figure 7:
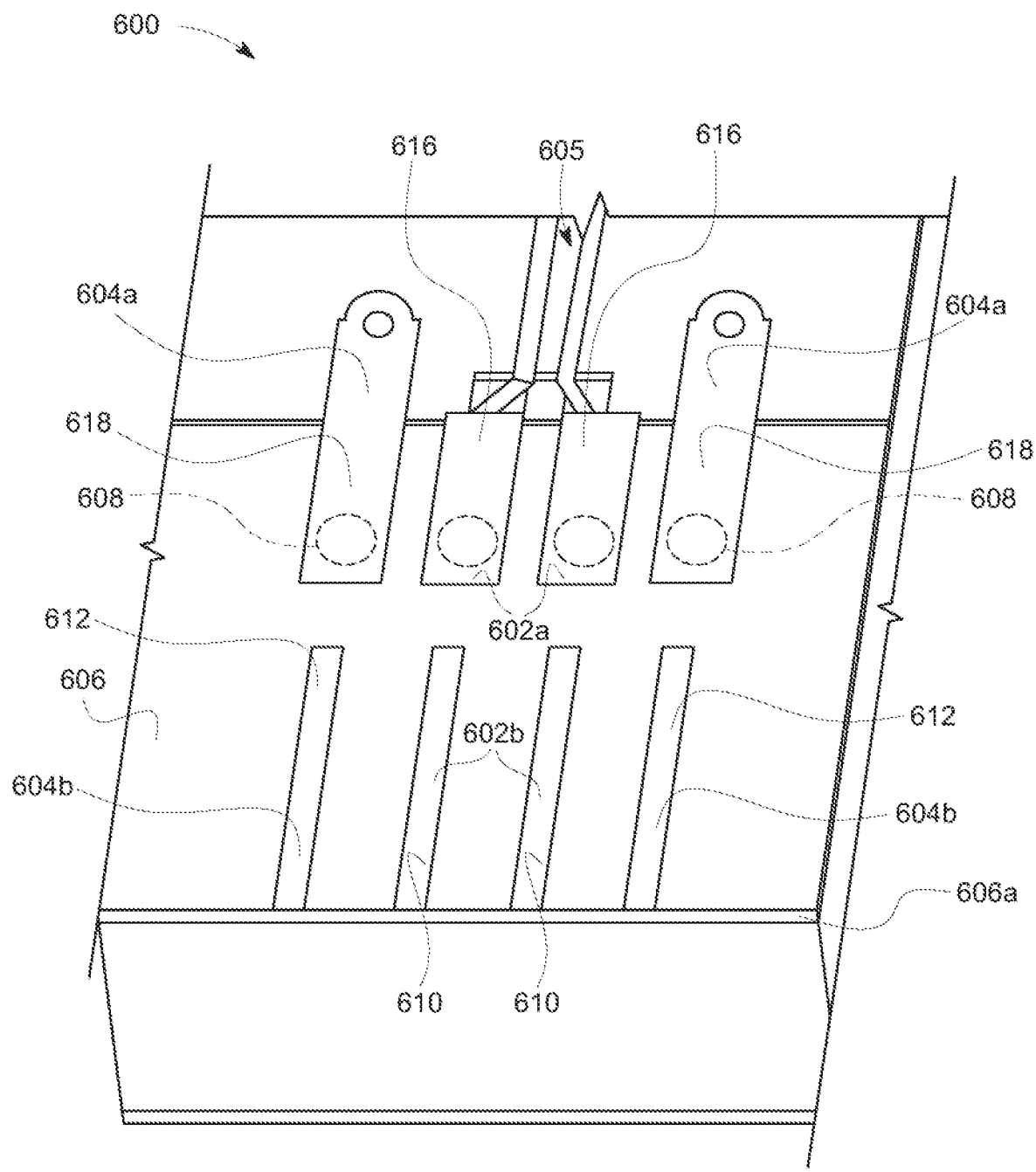
FIG. 7 illustrates the interface region of the expansion card of FIG. 6 after dividing the contact pads, according to aspects of the present disclosure.

FIG. 7 illustrates the interface region 600 after dividing the electrical pads 602 and 604 (both in FIG. 6), according to aspects of the present disclosure. Specifically, the signal pads 602 are divided into two portions that correspond to the signal electrical contacts 616 and the signal stubs 610 generally, at where the widths transition from the narrow portions 602b to the wide portions 602a. The ground pads 604 are divided into two portions that correspond to the ground electrical contacts 618 and the ground stubs 612 generally, at where the widths transition from the narrow portions 604b to the wide portions 604a.

The dividing can occur as disclosed above. Further, the dividing can similarly be generally about 0.1 millimeters below the contact point 608 between the connector pin (FIG. 1) and the signal electrical pads 602 and the ground electrical pads 604, although other distances can be used.

Because the signal electrical contacts 616 are divided from the signal stubs 610, the signal electrical contacts 616 are conductively isolated from the signal stubs 610. Similarly, because the ground electrical contacts 618 are divided from the ground stubs 612, the ground electrical contacts 618 are conductively isolated from the ground stubs 612. The signal stubs 610 and the ground stubs 612 also are conductively isolated from the circuit 605 of the printed circuit board. The conductive isolation prevents or prohibits the signal stubs 610, the ground stubs 612, or both, from affecting the signal margins.

The connector pins (e.g., connector pins 104 of FIG. 1) of the bus (e.g., bus 102 of FIG. 1) can still connect to the signal electrical contacts 616 and the ground electrical contacts 618, as illustrated by the contact point 608 still being aligned with the signal electrical contacts 616 and the ground electrical contacts 618.

Figure 2:
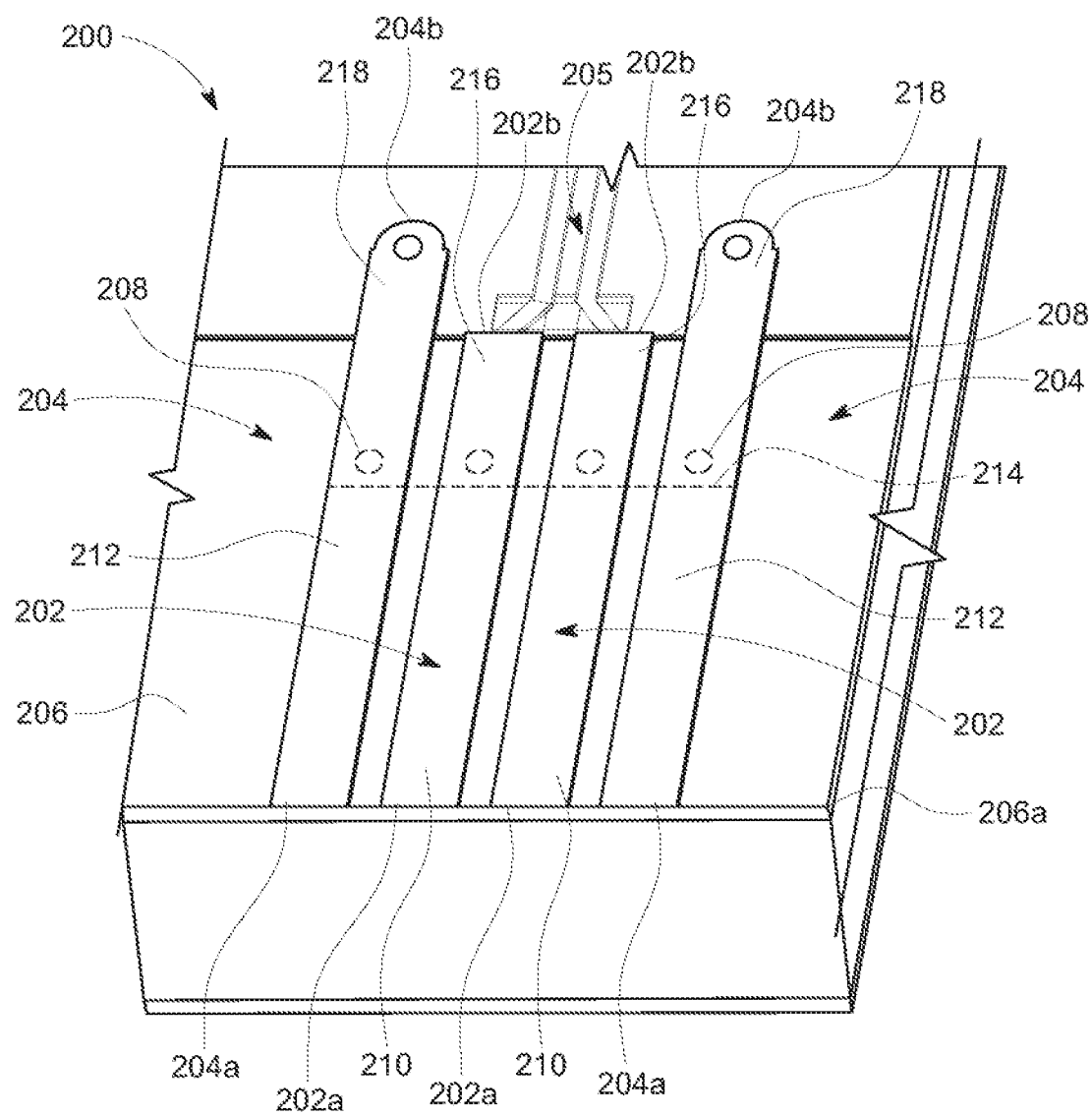
FIG. 2 illustrates an interface region of a conventional expansion card.
Figure 3:
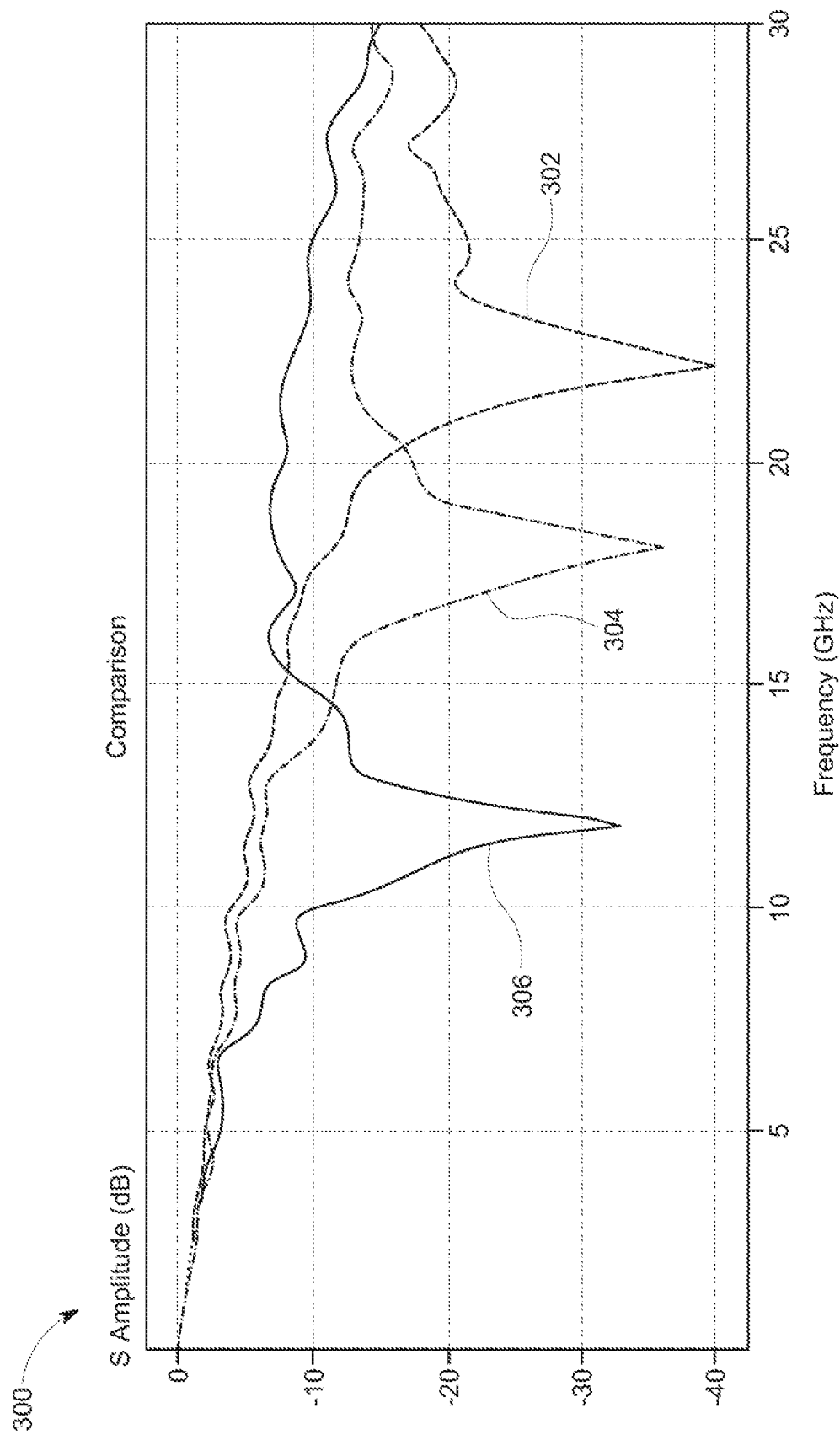
FIG. 3 illustrates signal loss measurements for different lengths of contact stubs of a conventional expansion card for a PCIe bus, as a function of signal frequency.
Figure 8:
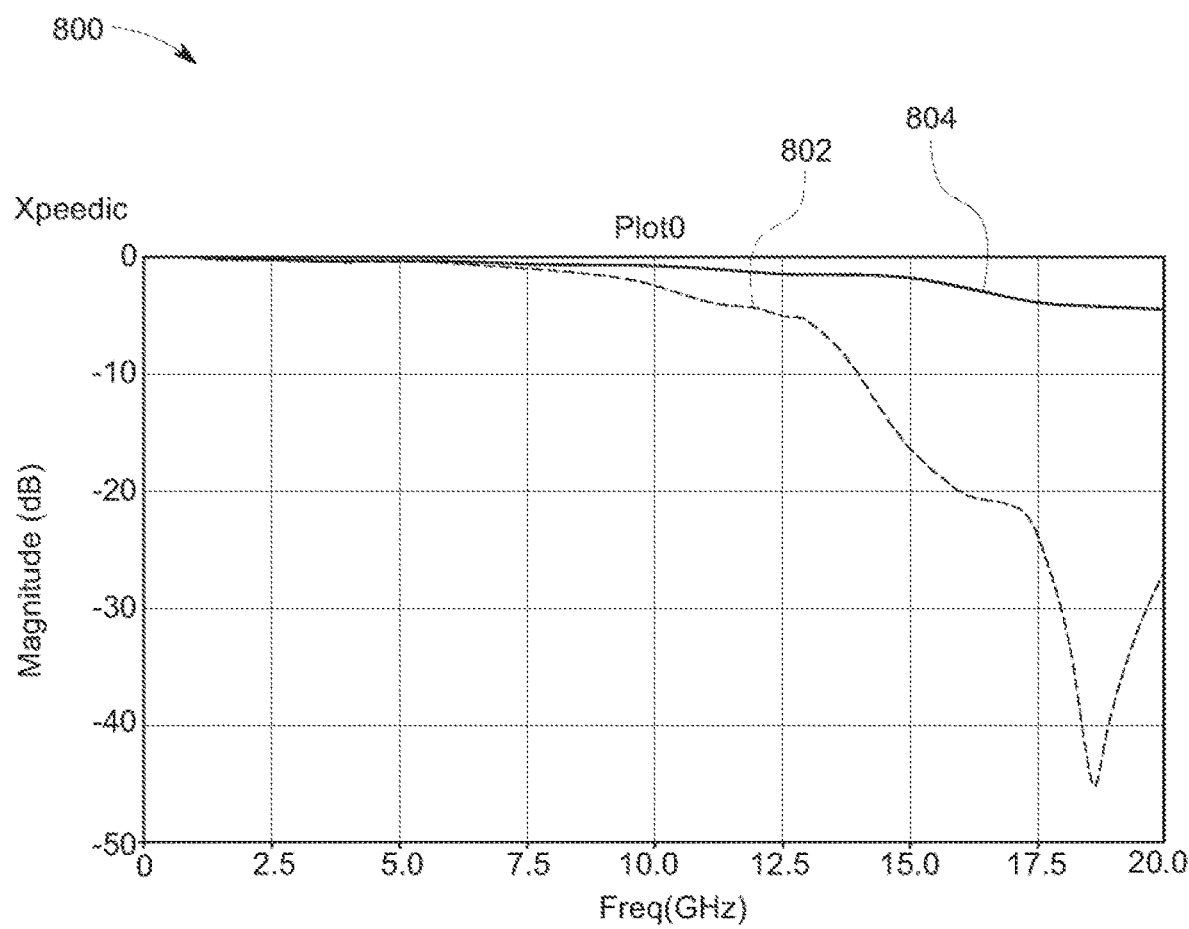
FIG. 8 illustrates a plot of signal loss measurements of expansion card interfaces formed from the interface regions illustrated in FIG. 2 and FIG. 7, according to aspects of the present disclosure.
Figure 9:
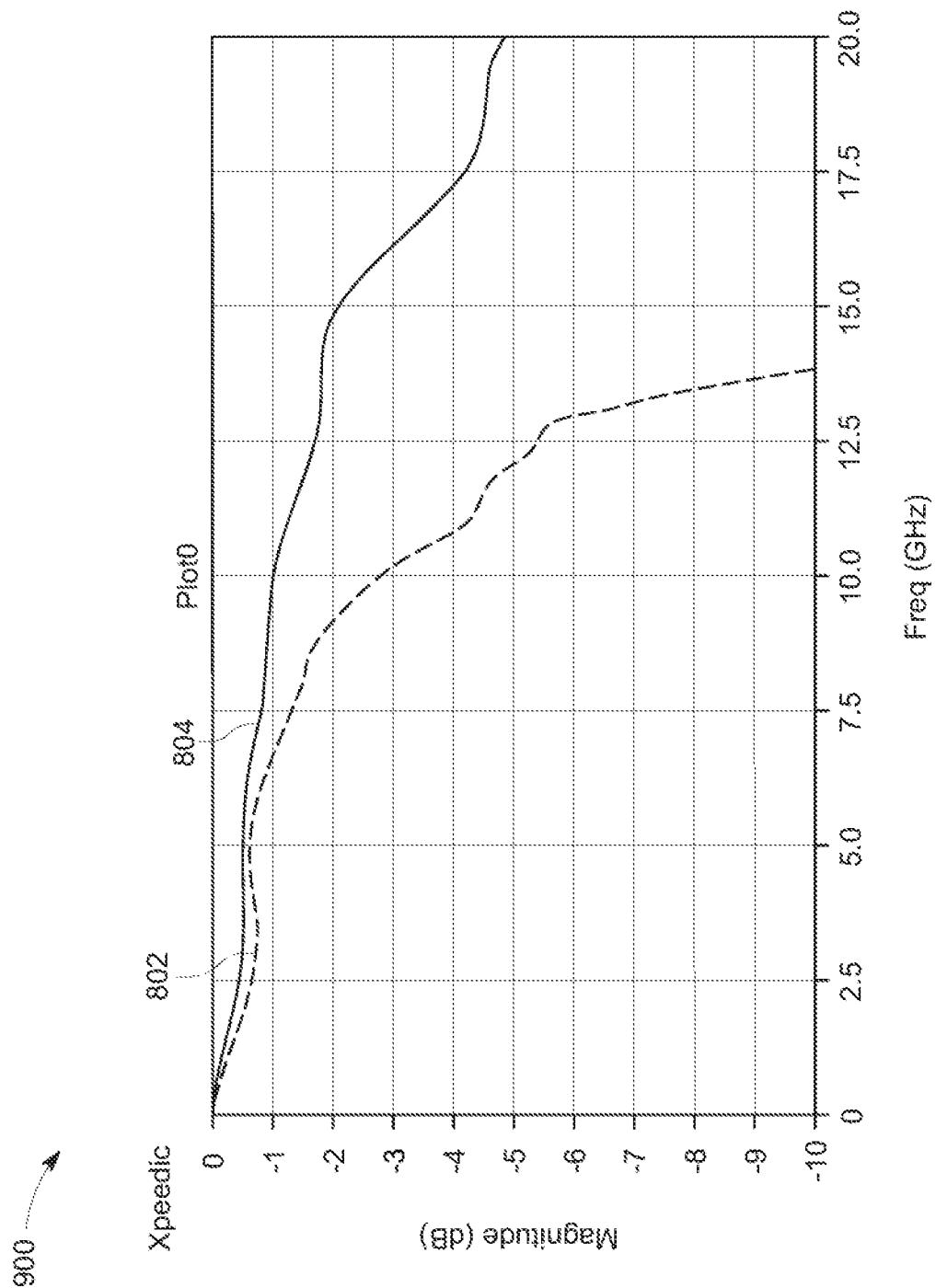
FIG. 9 illustrates a portion of the plot of FIG. 8, according to aspects of the present disclosure.

FIG. 8 illustrates a plot 800 comparing the signal loss measurements of the interface region 600 of FIG. 7, after dividing the contact pads, versus the interface region 200 of FIG. 2, according to aspects of the present disclosure. FIG. 9 illustrates a plot 900 of signal loss measurements from FIG. 8 focused on the 0 to −10 dB range on the y-axis. The lines 802 and 902 in FIGS. 8 and 9, respectively, illustrate the signal loss measurements of the interface region 200. In contrast, the lines 804 and 804 in FIGS. 8 and 9, respectively, illustrate the signal loss measurements of the interface region 600. The plots 800 and 900 show the improvement in the signal loss for the interface region 600 versus the interface region 200. Specifically, the line 802 shows a substantial amount of signal loss at higher frequencies for the interface region 200. However, after dividing the contact pads, the line 804 shows that there is much less signal loss at those higher frequencies for the interface region 600.

Figure 10:
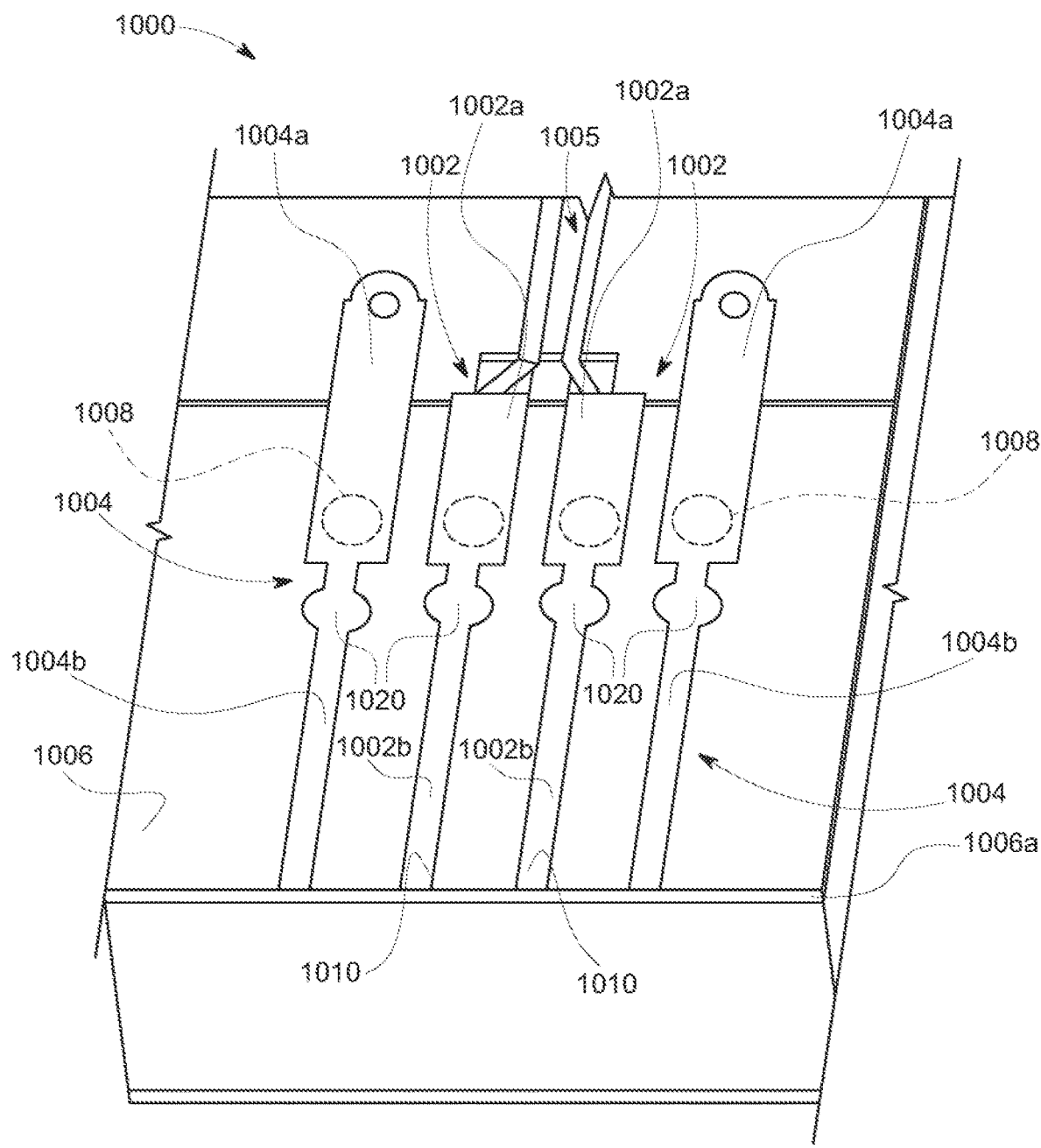
FIG. 10 illustrates another interface region of an expansion card prior to dividing the contact pads, according to aspects of the present disclosure.

FIG. 10 illustrates an interface region 1000 of another expansion card prior to dividing the contact pads, according to aspects of the present disclosure. The interface region 1000 includes four pods, which include two signal pads 1002 and two ground pads 1004. Although only two signal pads 1002 and two ground pads 1004 are shown in FIG. 10, the interface region 1000 of the expansion card can have more signal pads 1002 and more ground pads 1004. Thus, the two signal pads 1002 and the two ground pads 1004 are shown for convenience only.

Similar to the signal pads 602 and the ground pads 604 of the interface region 600 in FIG. 6, the signal pads 1002 and the ground pads 1004 have wide portions 1002a and 1004a, respectively; and narrow portions 1002b and 1004b, respectively, which are narrower than the wide portions 1002a and 1004a. As described above, the signal pads 1002 and the ground pads 1004 can be formed according to any conventional printed circuit board forming techniques, but with the change of having the narrow portions 1002b and 1004b.

Further, the narrow portions 1002b and 1004b may be formed to provide indicators 1020, or otherwise include the indicators 1020. The indicators 1020 visually mark where to divide the pads 1002 and 1004. Although illustrated as being widened circular areas of the narrow portions 1002a and 1004a, the indicators 1020 can be any type of visual indicia that marks where to divide the pads 1002 and 1004. For example, the indicators 1020 can instead be plus signs, the letter X, etc., printed or otherwise provided on the pads 1002 and 1004 to indicate where to divide the pads 1002 and 1004. Indicators 1020 can be formed from the same material as pads 1002, 1004, such as depicted in FIG. 10; or can be formed of another material, such as an ink that can be applied to pads 1002, 1004 or a substrate 1006. Further, although illustrated in reference to the pads 1002 and 1004 having the narrow portions 1002a and 1004a and the wide portions 1002b and 1004b, the indicators 1020 can be present on any type of contact pads, such as on the contact pads 402 and 404 of the interface region 400 of FIG. 4.

Figure 11:
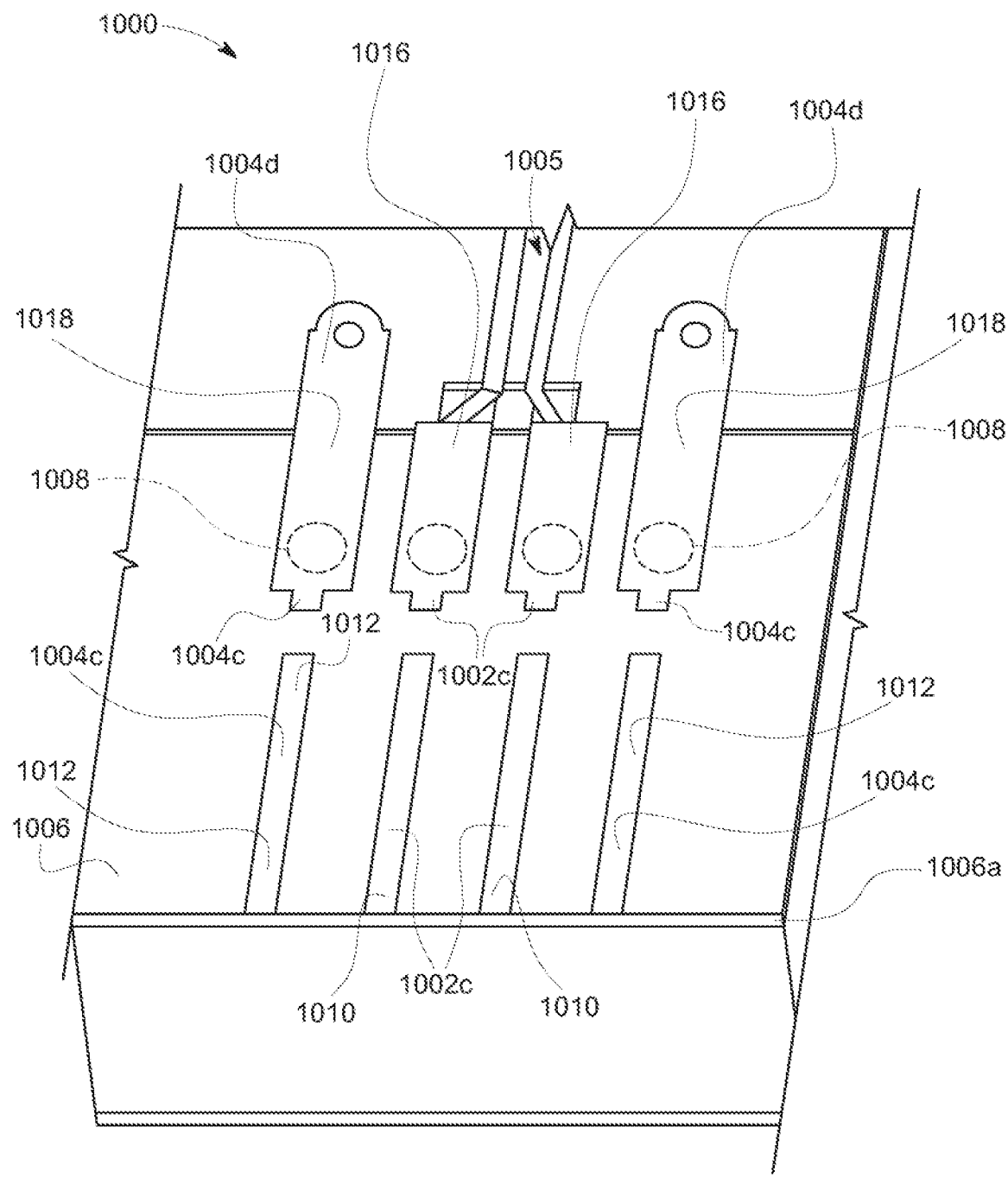
FIG. 11 illustrates the interface region of the expansion card of FIG. 10 after dividing the contact pads, according to aspects of the present disclosure.

FIG. 11 illustrates the interface region 1000 after dividing the electrical pads 1002 and 1004 at the locations of the indicators 1020, according to aspects of the present disclosure. Specifically, the signal pads 1002 are divided into two portions that correspond to the signal electrical contacts 1016 and the signal stubs 1010, generally at where the widths transition from the narrow portions 1002b to the wide portions 1002a. Similarly, the ground pads 1004 are divided into two portions that correspond to the ground electrical contacts 1018 and the ground stubs 1012, generally at where the widths transition from the narrow portions 1004b to the wide portions 1004a.

The dividing can occur as disclosed above. Further, the dividing can similarly be generally about 0.1 millimeters below the contact point 1008, i.e., the points where the connector pins (e.g., connector pin 104 of FIG. 1) contact the signal electrical pads 1002 and the ground electrical pads 1004—although other distances can be used.

Further, FIG. 11 illustrates that sections 1002c and 1004c of the narrow portions 1002b and 1004b, respectively, can remain touching the wide portions 1002a and 1004a after dividing the pads 1002 and 1004. The sections 1002c and 1004c can remain touching the wide portions 1002a and 1004a. This can occur if, for example, the amounts of the pads 1002 and 1004 that are removed, or the locations where the pads 602 and 604 are divided, result in remaining portions of the sections 1002c and 1004c from the narrow portions 1002b and 1004b.

Because the signal electrical contacts 1016 are divided from the signal stubs 1010, the signal electrical contacts 1016 are conductively isolated from the signal stubs 1010. Similarly, because the ground electrical contacts 1018 are divided from the ground stubs 1012, the ground electrical contacts 1018 are conductively isolated from the ground stubs 1012. The signal stubs 1010 and the ground stubs 1012 also are conductively isolated from the circuit 1005 of the printed circuit board. The conductive isolation prevents or prohibits the signal stubs 1010, the ground stubs 1012, or both from affecting the signal margins.

The benefits described herein with reference to divided contacts, such as those described with reference to FIGS. 8, 9, and 11, can be especially pronounced when high frequency signals are being used. In some cases, such a high-frequency signal can be between 4-10 GHz, 4-20 GHz, or higher, including signals with frequencies at or greater than approximately 4 GHz, 5 GHz, 6 GHz, 7 GHz, 8 GHz, 9 GHz, 10 GHz, 11 GHz, 12 GHz, 13 GHz, 14 GHz, 15 GHz, 16 GHz, 17 GHz, 18 GHz, 19 GHz, and/or 20 GHz. In some cases, the divided contacts disclosed herein can be configured for use with such high-frequency signals.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method of forming an expansion card interface for a printed circuit board, the method comprising:
   forming electrical pads of the expansion card interface on a substrate, the forming including forming at least one electrical pad to include a narrow portion and a wide portion; and
   dividing the at least one electrical pad into a first portion and a second portion, with the first portion conductively coupled to a circuit on the printed circuit board, the second portion conductively isolated from the first portion, and the first portion having the wide portion and at least a length of the narrow portion.

2. The method of claim 1, wherein the first portion is configured to contact a connector pin of a bus with the expansion card interface inserted into the bus.

3. The method of claim 2, wherein the dividing occurs about 0.1 millimeters from a contact point between the connector pin and the at least one pad.

4. The method of claim 1, wherein the dividing comprises mechanically modifying the at least one pad to form the first portion and the second portion.

5. The method of claim 4, wherein the mechanical modification is back-drilling the at least one pad.

6. The method of claim 4, wherein the mechanical modification is cutting the at least one pad.

7. The method of claim 6, wherein the cutting of the at least one pad occurs without cutting the printed circuit board.

8. The method of claim 1, wherein the dividing comprises chemically modifying the at least one pad to form the first portion and the second portion.

9. The method of claim 8, wherein the chemical modification is chemically etching the at least one pad.

10. The method of claim 1, wherein the forming of the at least one pad includes providing an indicator, and the dividing of the at least one pad occurs at the indicator.

11. The method of claim 1, wherein the first portion corresponds substantially to the wide portion, and the second portion corresponds substantially to the narrow portion.

12. The method of claim 1, wherein the expansion card interface includes ground pads and signal pads.

13. The method of claim 12, wherein the at least one pad is all of the signal pads.

14. The method of claim 12, wherein the at least one pad comprises at least one of the signal pads.

* * * * *